United States Patent
Chen

(10) Patent No.: US 8,248,078 B2
(45) Date of Patent: Aug. 21, 2012

(54) TESTING DEVICE AND METHOD FOR SM MEMORY CONNECTOR

(75) Inventor: Yang-Xin Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 401 days.

(21) Appl. No.: 12/617,943

(22) Filed: Nov. 13, 2009

(65) Prior Publication Data

US 2011/0012610 A1    Jan. 20, 2011

(30) Foreign Application Priority Data

Jul. 16, 2009 (CN) .......................... 2009 1 0304438

(51) Int. Cl.
*G01R 31/04* (2006.01)
*G01R 31/00* (2006.01)
(52) U.S. Cl. .......................................... 324/538; 702/58
(58) Field of Classification Search .................... 324/538
See application file for complete search history.

(56) References Cited

U.S. PATENT DOCUMENTS

| | | | |
|---|---|---|---|
| 5,097,213 A * | 3/1992 | Hunting et al. ............... | 324/538 |
| 5,625,292 A * | 4/1997 | Crook et al. .................. | 324/538 |
| 7,138,815 B1 * | 11/2006 | Alexander et al. .......... | 324/750.3 |
| 2003/0141877 A1 * | 7/2003 | Williams et al. ............. | 324/538 |
| 2008/0218175 A1 * | 9/2008 | Chen et al. .................... | 324/538 |

* cited by examiner

*Primary Examiner* — Jeff Natalini
(74) *Attorney, Agent, or Firm* — Altis Law Group, Inc.

(57) ABSTRACT

A testing device for testing surface-mounted (SM) memory connectors on a circuit board is provided. The testing device includes a main control circuit storing standard pin information of the SM memory connectors. A data collecting circuit is connected to the main control circuit and to at least one SM memory connector of the circuit board. A display unit is connected to the main control unit. The main control circuit directs the at least one data collecting circuit to read pin information of the SM memory connector and transmit the pin information to the main control circuit. The main control circuit manages the collected pin information in accordance with the standard pin information and shows the results on the display unit.

15 Claims, 6 Drawing Sheets

TESTING DEVICE AND METHOD FOR SM MEMORY CONNECTOR

BACKGROUND

1. Technical Field

The present disclosure relates to an electronic device and method for testing SM memory connector pin information.

2. Description of Related Art

Surface-mounted technology is gaining popularity in the electronics industry, with conventional memory connectors gradually being replaced with surface-mounted (SM) memory connectors. While devices such as flying probe testers are used to test pin function of conventional memory connectors, they cannot be used to test pin function of the SM memory connectors.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
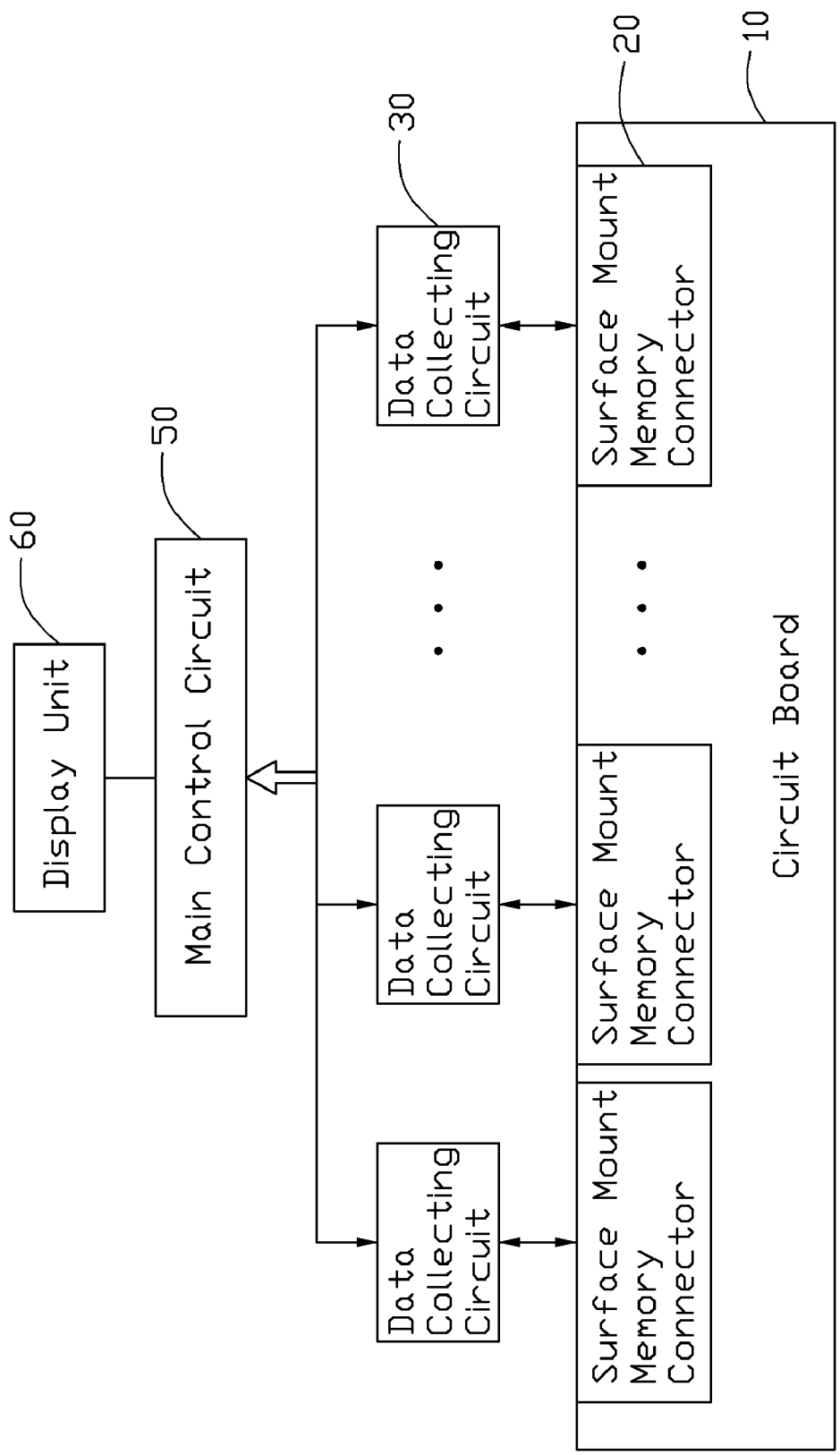
FIG. 1 is a block diagram of an embodiment of a testing device for a SM memory connector.

Referring to FIG. 1, an embodiment of a testing device for surface-mounted (SM) memory collectors 20 includes a circuit board 10 to be tested, a plurality of data collecting circuits 30, a main control circuit 50, and a display unit 60. The SM memory connectors 20 are disposed on the circuit board 10. Each SM memory collector 20 includes a plurality of pins B1-Bn and I1-In (see FIG. 4). Each data collecting circuit 30 is electronically coupled to a SM memory collector 20 to collect pin information of the SM memory collector 20 and relay the information to the main control circuit 50. The pin information includes static pin information and voltage signal state detection results. The main control circuit 50 stores standard pin information of the SM memory connectors 20. The display unit 60 is connected to the main control unit 50. The main control circuit 50 compares the collected pin information with standard pin information with the result shown on the display unit 60. The display unit 60 includes a universal serial bus (USB) port J1 (shown in FIG. 2).

Figure 2:
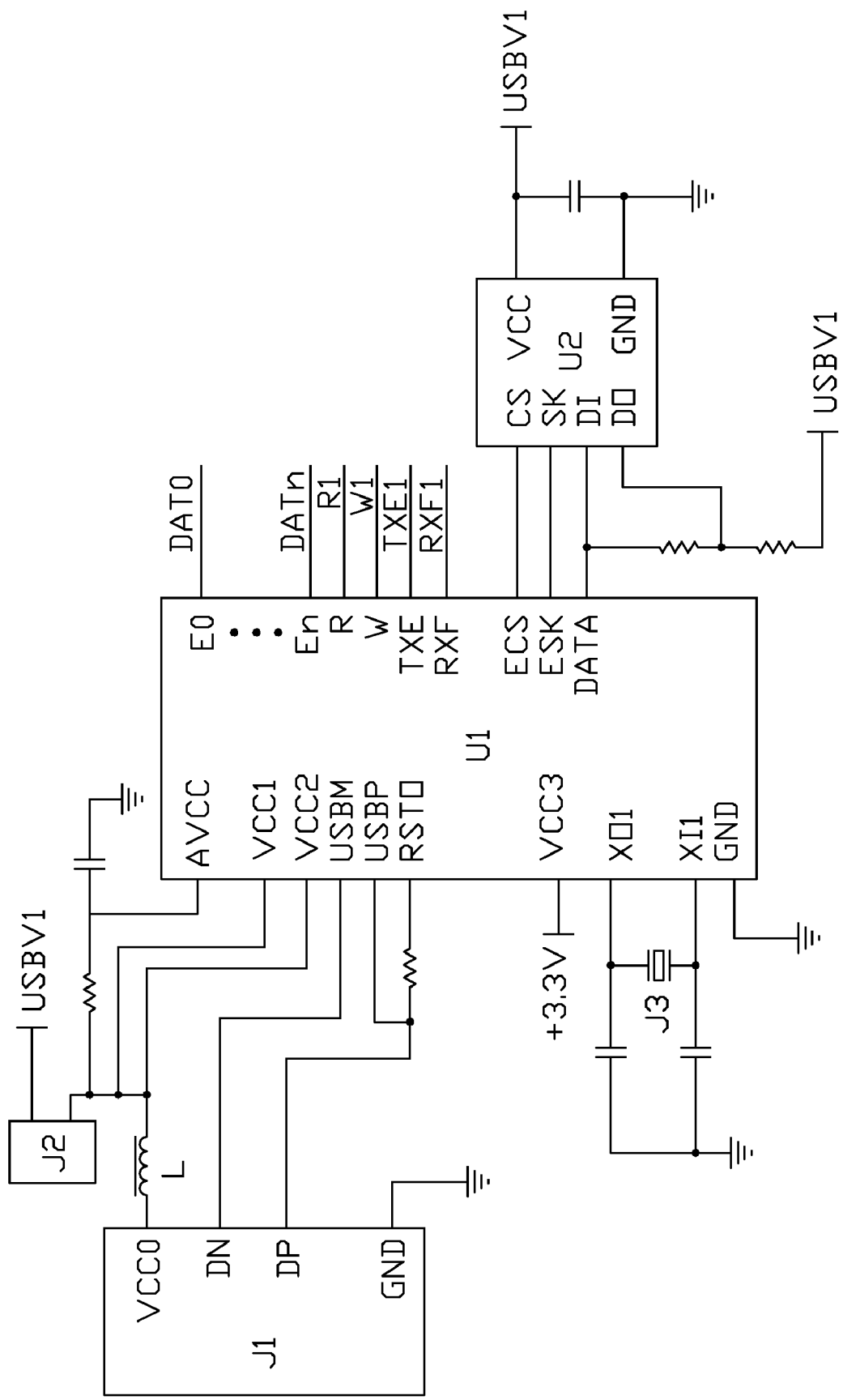
FIGS. 2 and 3 are circuit diagrams of a main control circuit of the testing device of FIG. 1.
Figure 3:
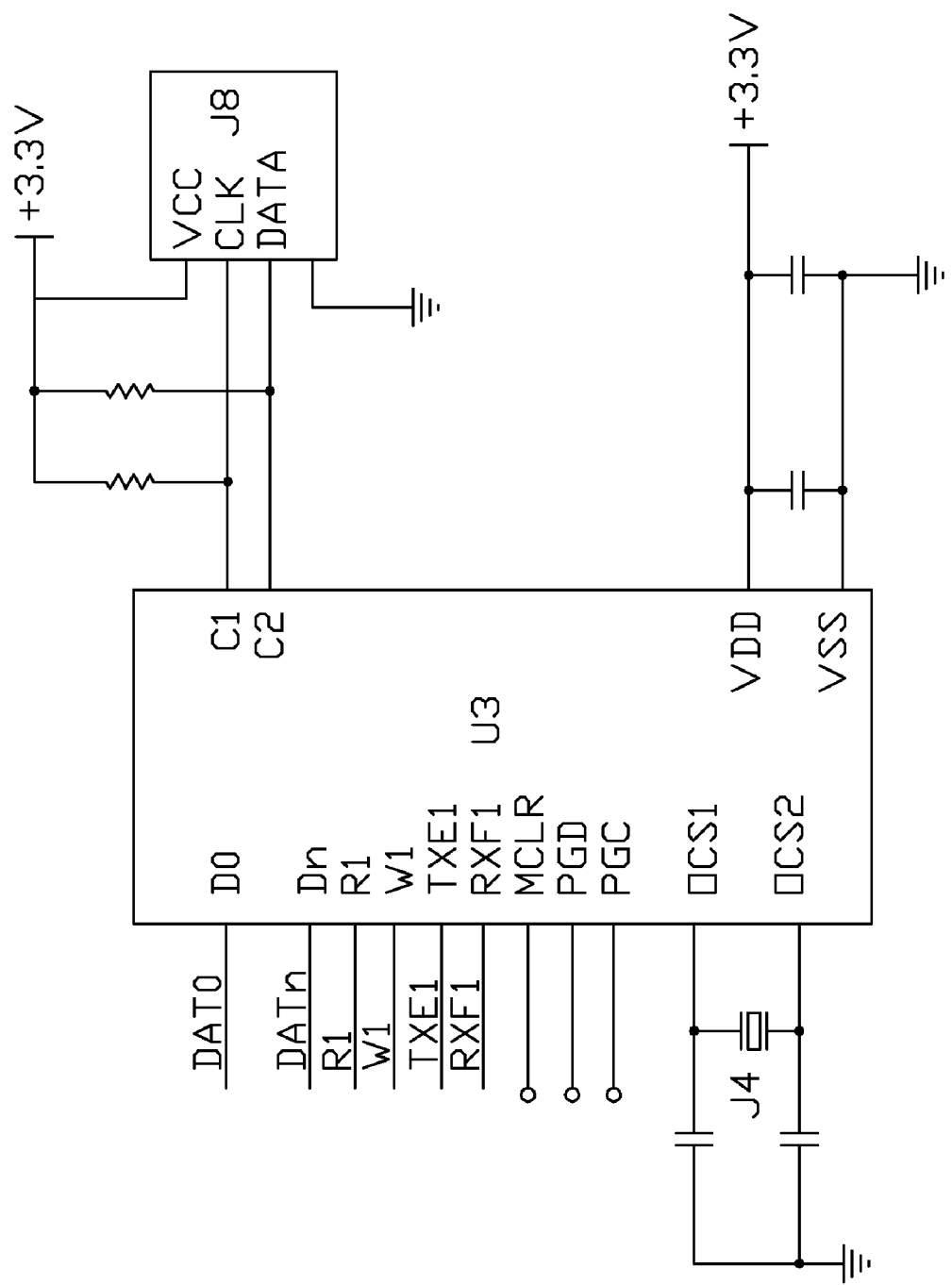

Referring to FIGS. 2 and 3, the main control circuit 50 includes a USB decrypting circuit U1, and a microprogrammed control unit (MCU) 55.

Referring to FIG. 2, the USB port J1 includes a voltage source pin VCC0, a ground pin GND, and two USB port signal transmitting pins DN and DP. The USB decrypting circuit U1 includes a plurality of parallel data pins E0-En; a plurality of control pins R, W, TXE, and RXF; a first power source pin AVCC; a second power source pin VCC1; a third power source pin VCC2, a fourth power source pin VCC3; a ground pin GND; two oscillatory signal input terminals XO1 and XI1; two USB decrypting circuit signal transmitting pins USBM and USBP; and a reset pin RSTO. In use, the display device 60 provides a 5V USB power source to the USB power source pin VCC0 of the USB port J1. The first, second, and third power source pins AVCC, VCC1, VCC2 are connected to the USB power source pin VCC0 to receive the USB voltage source. The fourth power source pin VCC3 is connected to a 3.3V voltage source so as to provide a working voltage for the USB decrypting circuit U1. The two oscillatory signal input terminals XO1 and XI1 are connected to ground via a crystal oscillator J3. The frequency value of the crystal oscillator J3 is about 6 MHertz (MHz). The USB decrypting circuit signal transmitting pin USBM is connected to the USB port signal transmitting pin DN, and the USB decrypting circuit signal transmitting pin USBP and the reset pin RSTO are connected to the USB port signal transmitting pin DP, so that the display device 60 is electronically connected to and communicates with the USB decrypting circuit U1 via the USB port J1. In one embodiment, the USB decrypting circuit U1 is a chip of type number FT245.

The USB decrypting circuit U1 further includes a clock pin ESK, a data transmitting pin DATA, and a selector pin ECS. The USB decrypting circuit U1 is electronically connected to a first storage unit U2 via the clock pin ESK, the data transmitting pin DATA, and the selector pin ECS. The USB port power source pin VCC0 outputs a USB voltage USBV1 to the first storage unit U2. The first storage unit 57 is configured to store ID information of the USB port decrypting circuit U1.

Referring to FIG. 3, the MCU U3 includes a plurality of parallel data transmitting pins D0-Dn and control pins R1, W1, TXE1, RXF1 corresponding to E0-En and R, W, TXE, RXF of the USB decrypting circuit U1. The USB port decrypting circuit U2 is connected to the MCU U3 with the parallel data pins E0-En that are respectively coupled to the pins D1-Dn of the MCU U3; and the control pins R, W, TXE, RXF of the USB decrypting circuit U1 are respectively coupled to R1, W1, TXE1, RXF1. Thus, the USB port decrypting circuit U2 is capable of converting serial data from the USB port J1 to parallel data and sending the parallel data to the MCU U3, and it is also capable of converting the parallel data from the MCU U3 into serial data and sending the serial data to the USB port J1. The MCU U3 further includes a plurality of programming burn pins MCLR, PGD, PGC, two MCU oscillatory signal input pins OSC1, OSC2, a MCU power source pin VDD, a MCU ground pin VSS, a MCU clock pin C1, and a MCU data transmitting pin C2. The MCU oscillatory signal input pins OSC1 and OSC2 are connected to ground via a second crystal oscillator J4 and two capacitors. The frequency value of the second crystal oscillator J4 is about 12 MHz. The MCU clock pin C1 and the MCU data transmitting pin C2 are connected to a clock pin CLK and a data transmitting pin DATA of a data transmitting connector J8, and connected to a 3.3V voltage via a resistor. In one embodiment, the MCU chip type is PIC18F4320.

Figure 4:
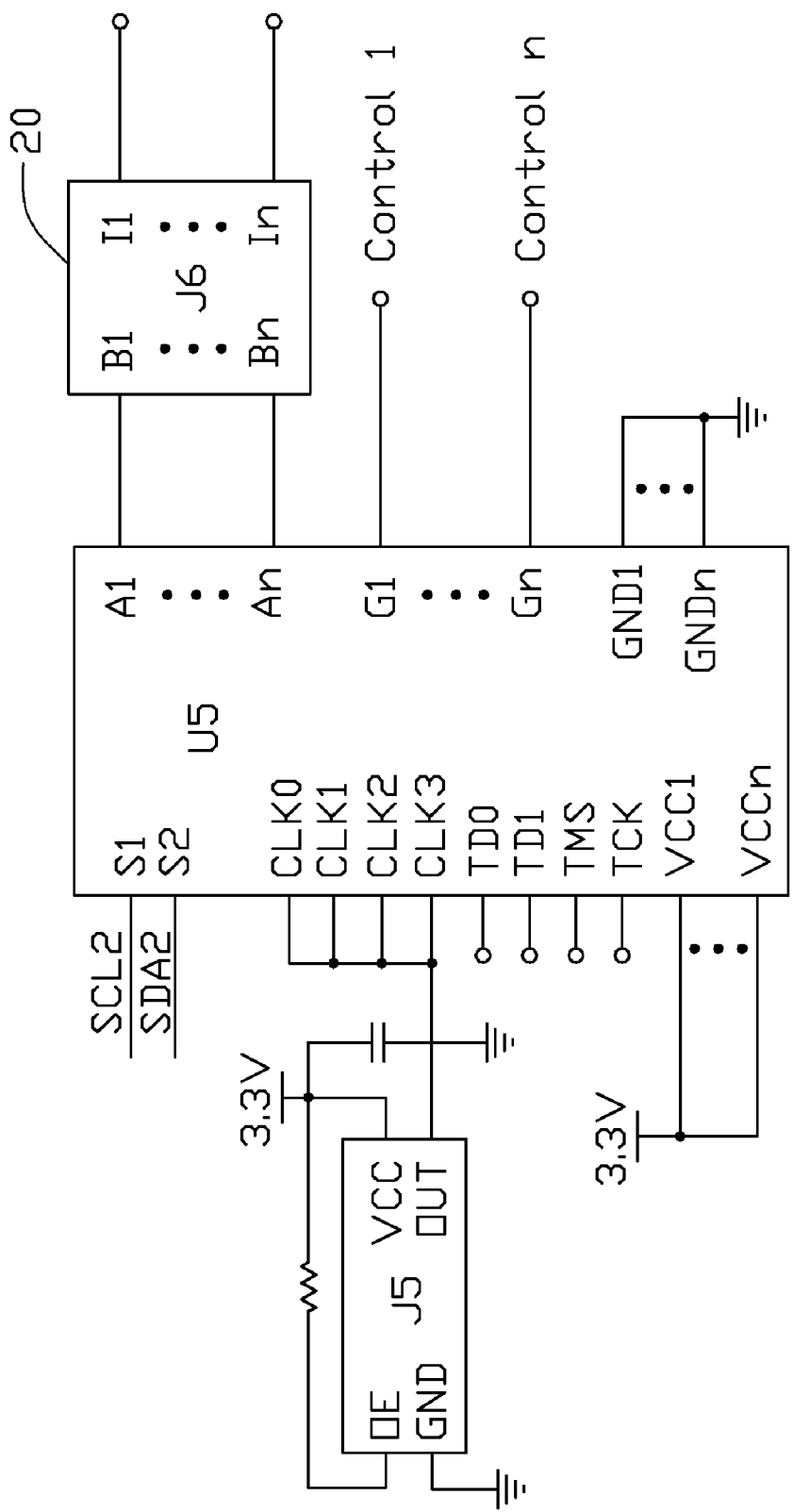
FIGS. 4 and 5 are circuit diagrams of a data collecting circuit of the testing device of FIG. 1.
Figure 5:
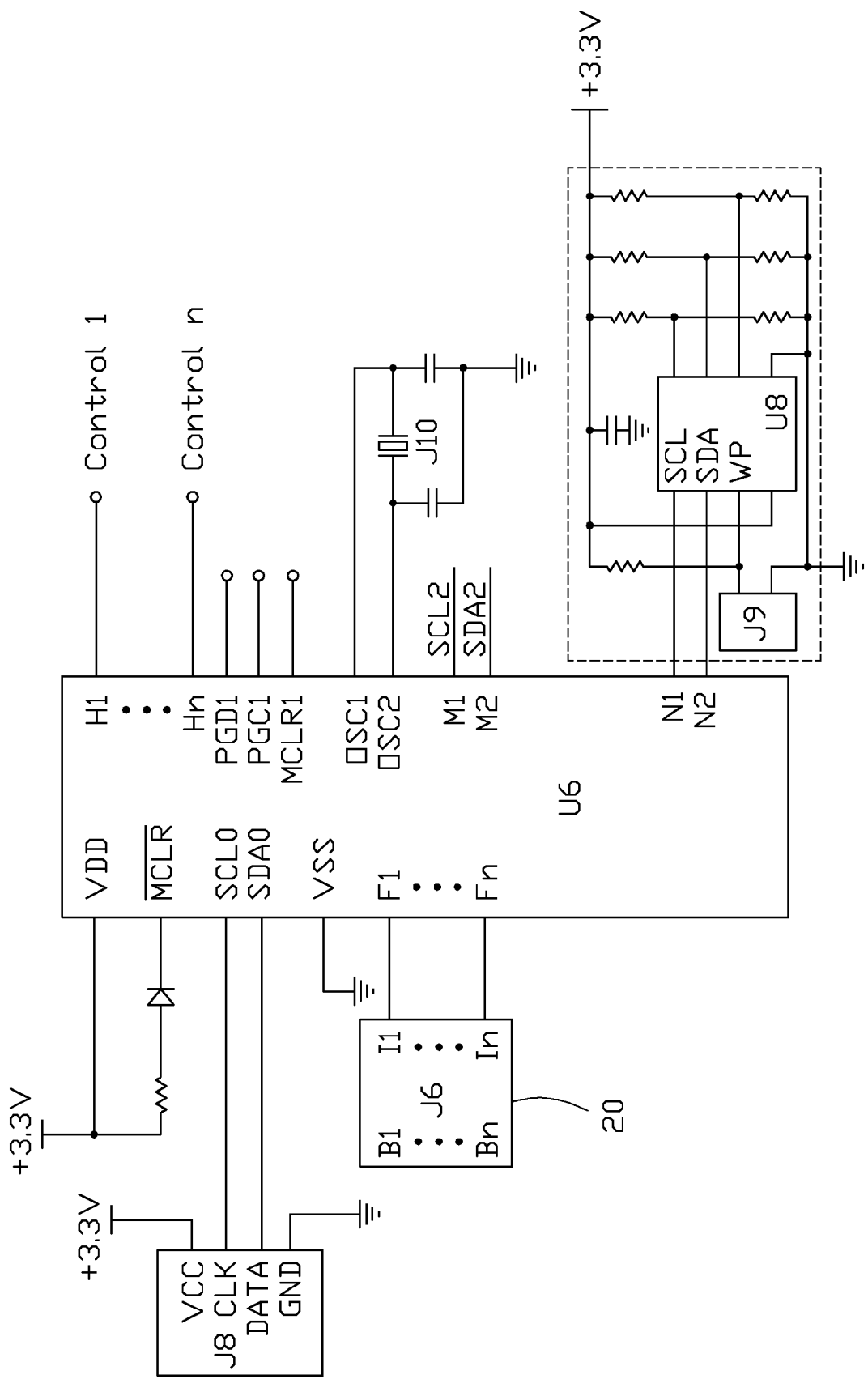

Referring to FIGS. 4 and 5, the data collecting circuit 30 includes a complex programmable logic digital device (CPLD) component U5, a voltage signal collecting unit U6, and a second storage unit U8 electronically coupled to the voltage signal collecting unit U6.

Referring to FIGS. 4 and 5, the data collecting circuit 30 includes a complex programmable logic device (CPLD) component U5, a voltage signal collecting unit U6, and a second storage unit U8 electronically coupled to the voltage signal collecting unit U6.

Referring to FIG. 4, the CPLD component U5 includes a plurality of data collecting pins A1-An corresponding to the pins B1-Bn of the SM memory connector 20, a plurality of oscillatory signal input pins CLK0-CLK3, a clock pin SCL2, a data transmitting pin SDA2, a plurality of power source pins VCC1-VCCn, and a plurality of ground pins GND1-GNDn. The data collecting pins A1-An are respectively connected to the pins B1-Bn of the SM memory connector 20. The oscillatory signal input pins CLK0-CLK3 are connected to a third crystal oscillator J5. The frequency value of the third crystal oscillator J5 is about 25 MHz. The power source pins VCC1-VCCn are connected to a 3.3V power source. In one embodiment, the CPLD chip type is LCMXO1200C-3FTN256C.

Referring to FIG. 5, the voltage signal collecting unit U6 includes a plurality of voltage signal collecting pins F1-Fn, a plurality of control pins H1-Hn, a plurality of program burn pins PGD1, PGC1, and MCLR1, and two oscillatory signal input pins OSC1, OSC2, a first clock pin M1, a first data transmitting pin M2, a second clock pin SCL0, a second data transmitting pin SDA0, a power source pin VDD, and a ground pin VSS. The voltage collecting pins F1-Fn are collected to the SM memory connector pins I1-In. The two oscillatory signal input pins OSC1, OSC2 are connected to a crystal oscillator J10. The frequency value of the crystal oscillator J10 is about 12 MHz. The first clock pin M3 is connected to the CPLD clock pin S1. The first data transmitting pin M2 is connected to the CPLD data transmitting pin S2. The second clock pin SCL0 is connected to clock pin CLK of the connector J8. The second data transmitting pin SDA0 is connected to the data transmitting pin DATA of the connector J8. Thus, the voltage signal collecting unit 33 is capable of being electronically coupled to the MCU U3 via the connector J8. In one embodiment, the voltage signal connecting unit is a chip of type number PIC24FJ64GA010.

The second storage unit U8 is an Electrically-Erasable Programmable Read-Only Memory (EEPROM). The EEPROM U8 includes a serial clock pin SCL, a serial data transmitting pin SDA, and a write-protection pin WP. The serial clock pin SCL and the serial data transmitting pin SDA are connected to the voltage signal collecting unit U6. The write-protection pin WP is connected to ground via a jumper J9. When the jumper J9 is shorted, the EEPROM is allowed to write information. When the jumper J9 is disengaged, the EEPROM is restricted from erasing information.

Figure 6:
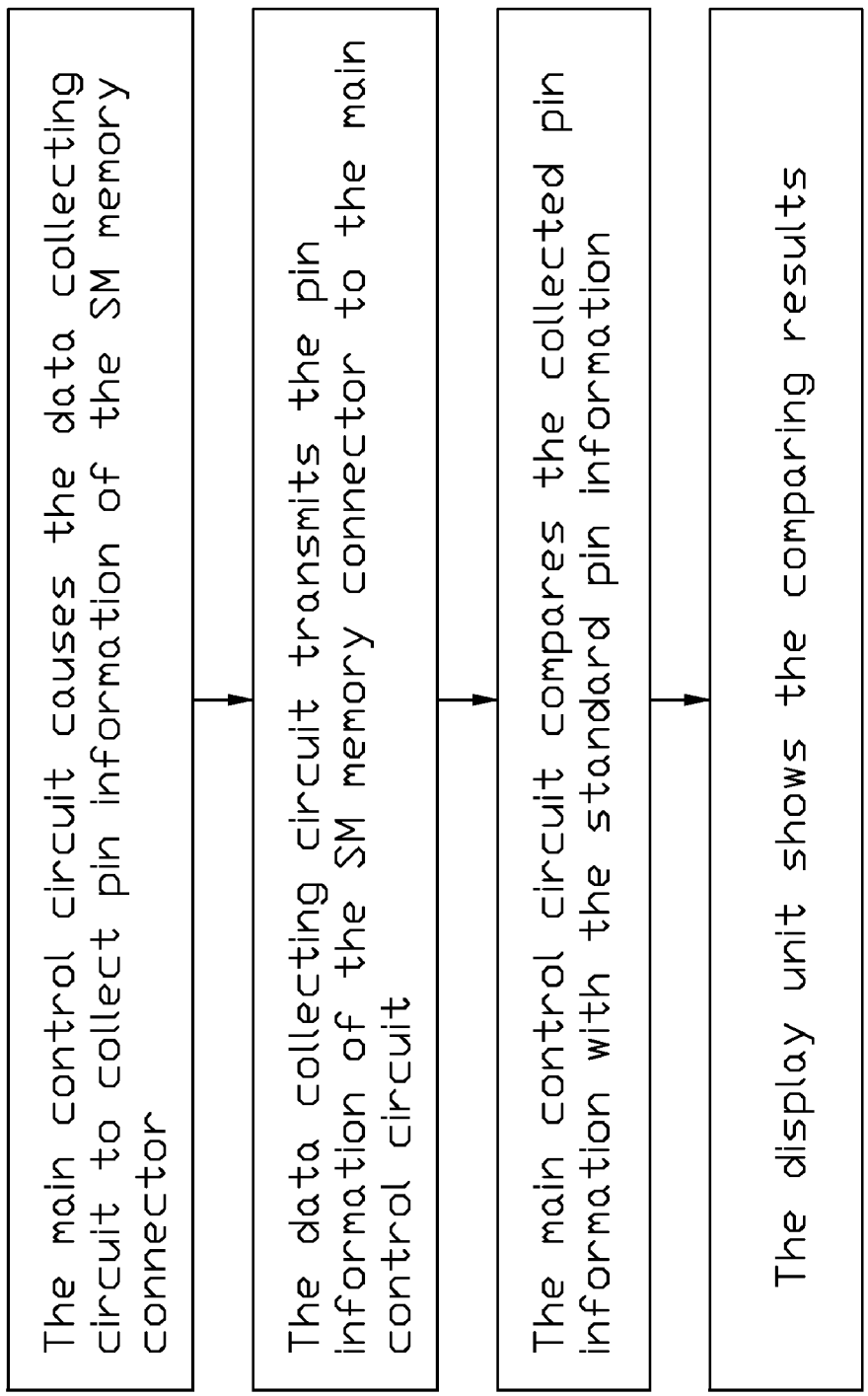
FIG. 6 is a flowchart of one embodiment of an SM memory connector testing method utilized by a testing device such as, for example, that of FIG. 1.

During testing, the SM memory connector testing device is connected as shown in FIGS. 1-5. Referring to FIG. 6, a testing method for the SM memory connector is illustrated. The CPLD component data transmitting pins A1-An collect the corresponding static pin information of the SM memory connector 20. The collected static pin information is sent to the voltage signal collecting unit U6 via the CPLD data transmitting pin S1. Concurrently, the voltage signal collecting pins F1-Fn of the voltage signal collecting unit U6 detect voltage signal states of the SM memory connector 20, and voltage signal collecting unit U6 sends the static pin information and voltage signal state detection results to the second storage unit U8. The MCU U3 reads the static pin information and voltage signal state detection results from the second storage unit U8 for comparison with the standard pin information. The comparison results are sent to the display unit 60 to inform pins state of the SM memory connector 20.

The voltage collecting unit clock pins SCL and data transmitting pins SDA of the plurality of data collecting circuits 30 are simultaneously connected to the MCU clock pin C1 and data transmitting pin C2 via the connector J8. The MCU U3 and the data collecting circuits 30 are communicated in a bilateral data transmitting manner, as are the data collecting circuits 30 and the SM memory connectors 20. During testing, the MCU U3 directs the SM memory connectors 20 to receive data from the corresponding data collecting circuits 30.

In detail, the CPLD components U5 of the data collecting circuits 30 each send a first group of binary data and a second group of binary data to the corresponding pins of the corresponding SM memory connector 20 in sequence. The second group of binary data value is converse to the first group of binary data value. After the SM memory connector pins receive the binary data, the corresponding voltage signal collecting unit U6 detects the voltage signal state of corresponding pins of the SM memory connector 20. If the voltage signal state of the SM memory connector pins are consistent with the data sent by the CPLD components U5, the pins are deemed functional; otherwise, pins receiving binary data different from the data collecting circuits 30 are considered to be malfunctioning.

For example, the first group of binary data may be set to 01001101 and the second group set to 10110010. The first and second groups of binary data are sent to the corresponding pins of the SM memory connectors 20 in sequence. The corresponding pins of the SM memory connectors 20 each receive two converse binary datum from the corresponding pins of the CPLD components U5. If the CPLD component U5 sends binary data 1 and 0 to one of the pins in sequence, but the voltage signal state of the pin detected by the voltage signal collecting unit U6 is always at high level, inconsistent with the binary data 0, the pin is considered to be in an abnormal state. Accordingly, the voltage signal collecting unit U6 sends the detection results to the MCU U3. The MCU U3 manages the detection results according to the standard pin information and sends the results to the USB decrypting circuit U1 which converts the parallel data from the MCU U3 to serial data and relays the data to the display unit 60 via the USB port J1.

It is to be understood, however, that even though numerous characteristics and advantages of the embodiments have been set forth in the foregoing description, together with details of the structure and function of the present disclosure, the disclosure is illustrative only, and changes may be made in detail, especially in matters of shape, size, and arrangement of parts within the principles of the embodiments to the full extent indicated by the broad general meaning of the terms in which the appended claims are expressed.

Depending on the embodiment, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A testing device for testing surface-mounted (SM) memory connectors on a circuit board, comprising:
   a main control circuit storing standard pin information of the SM memory connectors;
   at least one data collecting circuit connected to the main control circuit and to at least one SM memory connector of the circuit board; and
   a display unit connected to the main control unit;
   wherein the main control circuit directs the at least one data collecting circuit to read pin information of the SM memory connector and transmit the pin information to the main control circuit; the main control circuit manages the collected pin information in accordance with the standard pin information, and shows the results on the display unit; the at least one data collecting circuit comprises a complex programmable logic device (CPLD) component and a voltage signal collecting unit connected to the main control circuit, the CPLD component comprises a plurality of data collecting pins, a data transmitting pin, and at least one clock pin; the data collecting pins are connected to the pins of SM memory connector to collect static pin information, and the CPLD component outputs the static pin information to the voltage signal collecting unit via the data transmitting pin.

2. The testing device of claim 1, wherein the CPLD component is configured to send a first group of binary data and a second group of binary data to the SM memory connector in sequence, wherein the second group of binary data value is the reverse of the first group of binary data value.

3. The testing device of claim 2, wherein the voltage signal collecting unit is configured to detect the voltage signal states of the SM memory connector pins and sending the voltage signal states detection results and the static pin information to the main control circuit.

4. The testing device of claim 3, wherein the voltage signal collecting unit comprises a plurality of voltage signal collecting pins, a first data transmitting pin, a second data transmitting pin, a first clock pin, and a second clock pin; wherein the first data transmitting pin is connected to the CPLD component data transmitting pin; the voltage signal collecting pins are connected to the corresponding pins of the SM memory connector; the CPLD is configured to cause the voltage signal collecting unit to detect voltage signal state of the pins; and the voltage signal collecting unit is configured to send the static pin information and the voltage signal detection results to the main control circuit via the second data transmitting pin.

5. The testing device of claim 4, wherein the data collecting circuit further comprises a storage unit; and the storage unit is electrically coupled to the voltage signal collecting unit to store the static pin information and the voltage signal detection results.

6. The testing device of claim 4, wherein the main control circuit comprises a microprogrammed control unit (MCU), the MCU comprises a MCU data transmitting pin and a MCU clock pin; the MCU data transmitting pin and the MCU clock pin are connected to the second data transmitting pin and the second clock pin of the voltage signal collecting unit.

7. The testing device of claim 6, wherein the MCU comprises a plurality of parallel data transmitting pins, the display device comprises an universal serial bus (USB) port, and the main control circuit further comprises a USB port decrypting circuit connected to the USB port; the USB decrypting circuit comprises a plurality of parallel data pins; and the parallel data pins are connected to the MCU data transmitting pins so that the USB decrypting circuit is configured to convert parallel data from the main control circuit into serial data and sending the serial data to the display device via the USB port.

8. A method for testing surface-mounted (SM) memory connectors on a circuit board by a testing device, the testing device comprising a main control circuit storing standard pin information of the SM memory connectors, a data collecting circuit connected to the main control circuit and a corresponding SM memory connector, and a display unit connected to the main control circuit; the method comprising:
the main control circuit directing the data collecting circuit to collect pin information of the SM memory connector;
the data collecting circuit transmitting the pin information of the SM memory connector to the main control circuit;
the main control circuit comparing the collected pin information with the standard pin information; and
showing the comparison results on the display unit;
wherein the data collecting circuit comprises a complex programmable logic device (CPLD) component and a voltage signal collecting unit connected to the main control circuit, the pin information comprises static pin information and voltage signal state detection information; and
the CPLD component collects static pin information and outputs the static pin information to the voltage signal collecting unit; the CPLD component sends a first group of binary data and a second group of binary data to the SM memory connector in sequence, wherein the second group of binary data value is the reverse of the first group of binary data value.

9. The method of claim 8, wherein the voltage signal collecting unit detects the voltage signal states of the SM memory connector pins and stores the voltage signal states detection information and the static pin information in a storage unit.

10. The method of claim 8, wherein after the CPLD component sends the first and second groups of binary data to the SM connector, the CPLD component directs the voltage signal collecting unit to detect the voltage signal state of the SM memory connector pins.

11. The method of claim 8, wherein if the voltage signal state of the SM memory connector pins is consistent with the binary data sent by the CPLD component, the pins are deemed functional; and if the voltage signal state of the SM memory connector pins are inconsistent with the binary data sent by the CPLD component, the pins which receive different binary data from the data collecting circuits are deemed malfunctioning.

12. The method of claim 8, wherein the comparison results are parallel data, and a USB port decrypting circuit converts the parallel comparison results into serial data and sends the data to a display unit via a USB port.

13. A method for testing surface-mounted (SM) memory connectors on a circuit board, comprising:
directing a data collecting circuit to collect pin information of the SM memory connectors by a main control circuit;
transmitting the pin information of the SM memory connector to the main control circuit by a data collecting circuit;
comparing the collected pin information with a standard pin information by the main control circuit; and
showing the comparison results on a display unit;
wherein the data collecting circuit comprises a complex programmable logic device (CPLD) component and a voltage signal collecting unit connected to the main control circuit, the pin information comprises static pin information and voltage signal state detection information; and
the CPLD component collects static pin information and outputs the static pin information to the voltage signal collecting unit; the CPLD component sends a first group of binary data and a second group of binary data to the SM memory connector in sequence, wherein the second group of binary data value is the reverse of the first group of binary data value.

14. The method of claim 13, wherein the voltage signal collecting unit detects the voltage signal states of the SM memory connector pins and stores the voltage signal states detection information and the static pin information in a storage unit.

15. The method of claim 13, wherein after the CPLD component sends the first and second groups of binary data to the SM connector, the CPLD component directs the voltage signal collecting unit to detect the voltage signal state of the SM memory connector pins.

* * * * *